(12) United States Patent
Ogura et al.

(10) Patent No.: US 6,982,484 B2
(45) Date of Patent: Jan. 3, 2006

(54) SEMICONDUCTOR JOINING SUBSTRATE UTILIZING A TAPE WITH ADHESIVE AND COPPER-CLAD LAMINATE SHEET

(75) Inventors: Mikihiro Ogura, Kusatsu (JP); Syouji Kigoshi, Otsu (JP); Masami Tokunaga, Otsu (JP); Yasuaki Tsutsumi, Otsu (JP); Ryuichi Kamei, Kyoto (JP); Ken Shimizu, Kyoto (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 10/111,302

(22) PCT Filed: Aug. 22, 2001

(86) PCT No.: PCT/JP01/07183

§ 371 (c)(1),
(2), (4) Date: Apr. 23, 2002

(87) PCT Pub. No.: WO02/17379

PCT Pub. Date: Feb. 28, 2002

(65) Prior Publication Data

US 2003/0031867 A1    Feb. 13, 2003

(51) Int. Cl.
  *H01L 23/06*  (2006.01)
(52) U.S. Cl. ............... 257/729; 257/783; 156/330; 438/118
(58) Field of Classification Search ............. 257/666, 257/672, 674, 676, 735, 782, 783, 729; 438/118, 438/119; 156/327, 330
See application file for complete search history.

(56) References Cited

U.S. PATENT DOCUMENTS 4,868,050 A * 9/1989 Tanaka et al. .............. 428/335
5,365,113 A * 11/1994 Sakuta et al. ............... 257/786

(Continued)

FOREIGN PATENT DOCUMENTS

EP    2000208563    7/2000

(Continued)

OTHER PUBLICATIONS

Supplementary European Search Report (Jan. 28, 2005).

*Primary Examiner*—Alonzo Chambliss
(74) *Attorney, Agent, or Firm*—Morrison & Foerster LLP

(57) ABSTRACT

The present invention relates to an adhesive-backed tape for semiconductors which is characterized in that it is composed of a laminate of an insulating film layer having the following characteristics (1) and (2) and at least one adhesive agent layer in the semi-cured state.
  (1) The coefficient of linear expansion in the film transverse direction (TD) at 50–200° C. is 17–30 ppm/° C.
  (2) The tensile modulus of elasticity is 6–12 GPa By means of this construction the present invention can provide, on an industrial basis, an adhesive-backed tape suitable for producing semiconductor devices, together with copper-clad laminates, semiconductor connecting substrates and semiconductor devices employing said tape, and it enables, the reliability of semiconductor devices for high density mounting to be enhanced.

19 Claims, 3 Drawing Sheets

U.S. PATENT DOCUMENTS

| | | | | |
|---|---|---|---|---|
| 5,406,124 A | * | 4/1995 | Morita et al. | 257/783 |
| 5,593,774 A | * | 1/1997 | Hiroe et al. | 428/343 |
| 5,739,263 A | * | 4/1998 | Yoshida et al. | 528/353 |
| 5,742,101 A | * | 4/1998 | Sakuta et al. | 257/786 |
| 5,837,368 A | * | 11/1998 | Hiroe et al. | 428/343 |
| 6,031,068 A | * | 2/2000 | Okada | 528/353 |
| 6,217,996 B1 | | 4/2001 | Yamamoto et al. | |
| 6,265,042 B1 | | 7/2001 | Oka et al. | |
| 6,303,219 B1 | * | 10/2001 | Sawamura et al. | 428/343 |
| 6,335,571 B1 | * | 1/2002 | Capote et al. | 257/787 |
| 2002/0072145 A1 | * | 6/2002 | Tanaka et al. | 438/106 |

FOREIGN PATENT DOCUMENTS

| | | | |
|---|---|---|---|
| JP | 07278258 | | 10/1995 |
| JP | 8-174659 A | | 9/1996 |
| JP | 8-335654 A | | 12/1996 |
| JP | 10-107093 A | | 4/1998 |
| JP | 10-178054 A | | 6/1998 |
| JP | 11-233567 A | | 8/1999 |
| JP | 2000129001 A | * | 5/2000 |
| JP | 2000-174073 A | | 6/2000 |
| JP | 2000208563 A | * | 7/2000 |

* cited by examiner

SEMICONDUCTOR JOINING SUBSTRATE UTILIZING A TAPE WITH ADHESIVE AND COPPER-CLAD LAMINATE SHEET

TECHNICAL FIELD

The present invention relates to an adhesive-backed tape suitable for the production of semiconductor devices where there is employed a film-form adhesive agent, such as in the case of the patterned tape used in tape automated bonding (TAB), the semiconductor connecting substrate such as an interposer used for a ball grid array (BGA) package, die bonding materials, lead frame fixing tape, LOC tape, the interlayer adhesive sheets of a multilayer substrate and the like, employed when mounting semiconductor integrated circuits; and to a copper-clad laminate, semiconductor connecting substrate and semiconductor device employing same.

PRIOR-ART

Conventional semiconductor integrated circuit (IC) mounting techniques comprise the following.

In the mounting of ICs, methods employing lead frames made of metal are most often used but, recently, there has been an increase in methods employing a connecting substrate where the conductor pattern for IC connection is formed on an organic insulating film such as a glass epoxy or polyimide. A typical example is the tape carrier package (TCP) based on the tape automated bonding (TAB) method.

In producing the TCP connecting substrate (the patterned tape), there is, generally used an adhesive-backed tape for TAB (hereinafter this is referred to as the tape for TAB use). Normally, the tape for TAB use has a three-layer construction comprising an uncured adhesive agent layer and a polyester film with release properties which serves as a protective film, provided on a flexible organic insulating film.

The tape for TAB use is processed into TAB tape (the patterned tape), which is the connecting substrate, via processing stages such as (1) providing sprocket and device holes, (2) hot lamination of copper foil and hot curing of the adhesive agent, (3) pattern formation (application of a resist, etching and removal of the resist), and (4) a tin or gold-plating treatment, etc. FIG. 1 shows the form of the patterned tape. On organic insulating film 1 are the adhesive agent 2 and the conductor pattern 5, and there are provided sprocket holes 3 for feeding the film and device holes 4 in which the devices are set. FIG. 2 shows in cross-section one embodiment of a TCP type semiconductor device. By hot pressure bonding (inner lead bonding) of the inner lead portions 6 of the patterned tape to the gold bumps 10 of semiconductor integrated circuit 8, the semiconductor integrated circuit is attached. Next, the semiconductor device is produced via a resin sealing process based on sealing resin 9. Finally, other components are connected to the attached integrated circuit, etc, via outer lead 7, and the TCP type semiconductor device mounted on electronic equipment.

On the other hand, along with the miniaturization and weight reduction of electronic equipment in recent years, for the purposes of still higher density mounting of semiconductor packages, there have been used BGAs (ball grid arrays) or CSPs (chip scale packages) where the connection terminals are arranged on the package underside. In the same way as a TCP, a connecting substrate known as an interposer is essential in a BGA or CSP. However, they differ in terms of the IC connection method in that, with a conventional TCP the TAB system of gang bonding predominates, whereas with a BGA or CSP either a TAB system or a wire bonding system is selected according to the individual package specifications, the application or the design goals, etc. FIG. 3 and FIG. 4 show cross-sections of embodiments of such semiconductor devices (BGA or CSP repectively). In the figures, 12 and 20 denote the organic insulating film, 13 and 21 the adhesive agent, 14 and 22 the conductor pattern, 15 and 23 the semiconductor integrated circuit, 16 and 24 the sealing resin, 17 and 25 gold bumps, 18 and 26 solder balls, 19 a reinforcing board, and 27 a solder resist.

The interposer referred to here has the same kind of function as the aforesaid TCP patterned tape, so it is possible to employ the adhesive-backed tape used for TAB. This will of course be useful in connection systems having an inner lead, but it is particularly applicable in a process where copper foil is laminated following the mechanical punching of holes for solder balls and device holes for ICs. On the other hand, for connection by wire bonding, an inner lead is not, necessary, and in the process of introducing holes for solder balls and IC device holes along with the copper foil, there may be used a copper clad laminate where the lamination of the copper foil and hot curing of the adhesive have already been carried out.

In the most advanced area array type packages such as those of the CSP and BGA type, there is a considerable demand for still higher mounting densities, and so there is an increasingly narrow pitch of the solder balls which serve as the external terminals. For example, there is a reduction in the solder ball pitch from the conventional 1.27 mm to 1.00 mm, and a reduction in the via hole diameter from 1 mm to 0.5 mm. Along with this, in the case of the insulating film such as polyimide which constitutes the base film, at the conventional thickness of 75 $\mu$m difficulties are frequently brought about in the punching process and there is a considerable demand to move to a 50 $\mu$m thickness.

However, when the thickness is less than 75 $\mu$m, there arises the problem of a lowering of stiffness and a tendency for warping to occur at the time of the cladding with copper foil. In addition, in terms of facilitating ultrafine-processing, there is also a tendency towards thinner copper foil, and rather than the conventional thickness of 35 $\mu$m, currently copper foil of thickness, 18 $\mu$m or 15 $\mu$m has become the mainstream, but this too is a factor in the occurrence of the problem of warping.

Thus, in the case of a conventional adhesive-backed tape, there has been investigated a method for eliminating warping by introducing a siloxane structure into the adhesive agent and providing flexibility (U.S. Pat. No. 5,180,627).

However, all attempts at reducing warping based on improving the adhesive agent, including this particular method, have hitherto been unable to provide an adequate effect and they have been difficult to put into practice. This is because, while there is a certain degree of effectiveness in cases where the residual percentage copper foil after forming the circuit pattern is small, in cases where the residual percentage copper foil is large no warping reduction effect is to be seen in the copper foil laminated or post-cured states. In other words, the warping varies according to the residual percentage of copper foil.

For the processed tape manufacturer, it is preferred that there be no warping in the stages described above, and a reduction in warping is desirable both in the copper-foil-laminated state and in the state following the formation of the circuit pattern. It has not been possible by the prior art to meet such demands and simultaneously achieve both a reduction in warping in the copper-foil-laminated state and in the state following the formation of the circuit pattern.

The objective of the present invention lies in resolving such problems by improving the properties of the insulating film, such as the polyimide, which constitutes the base, film, and to offer an adhesive-backed tape for semiconductors which has outstanding dimensional stability and enables there to be simultaneously achieved both a reduction in warping in the copper-foil-laminated state and in the state following the formation of the circuit pattern; together with a copper clad laminate, a semiconductor connecting substrate and a semiconductor device employing said adhesive-backed tape.

Furthermore, in the case of IC connection by the wire bonding method, there is a demand for the adhesive agent to maintain a high elastic modulus at bonding temperatures of 110–200° C. If the elastic modulus of the adhesive agent is raised for this purpose, problems then arise such as splitting of the adhesive agent in the punching process. Thus, a further objective of the present invention is an adhesive-backed tape for semiconductors which provides both good punchability and retention of adhesive agent modulus of elasticity at high temperatures.

DISCLOSURE OF THE INVENTION

The present invention relates to an adhesive-backed tape for semiconductors which is characterized in that it is composed of a laminate of an insulating film layer having the following characteristics (1) and (2), and at least one adhesive agent layer in the semi-cured state.

(1) The coefficient of linear expansion of the film in the transverse direction (TD) at 50–200° C. is 17–30 ppm/° C.

(2) The tensile modulus of elasticity is 6–12 GPa

EXPLANATION OF THE NUMERICAL CODES

Figure 1:
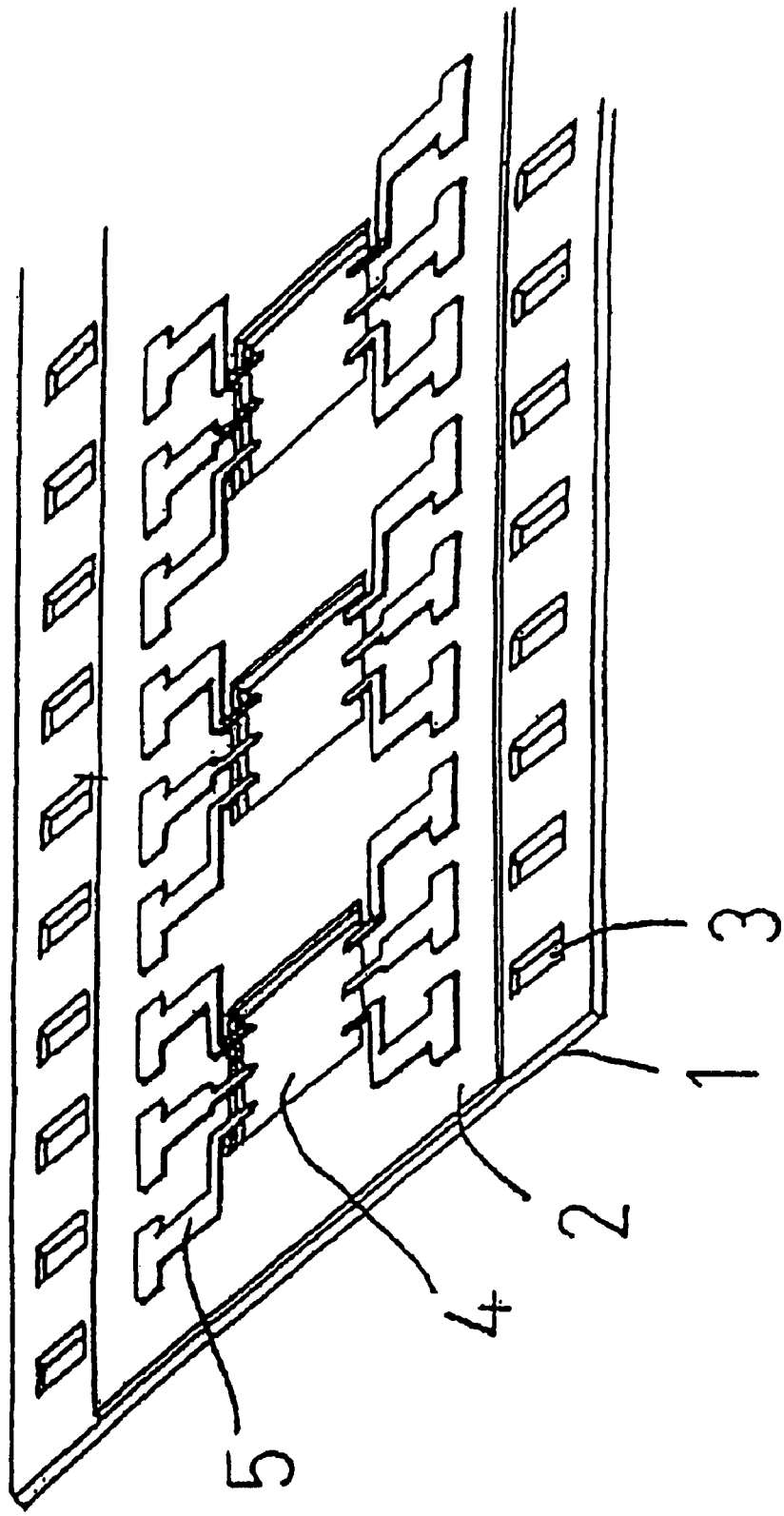
FIG. 1 shows a perspective view of an embodiment of the semiconductor connecting substrate (patterned tape) prior to the mounting of the semiconductor integrated circuits, which is obtained by processing the adhesive-backed tape for semiconductor devices of the present invention.

| 1, 12, 20 | insulating film |
|---|---|
| 2, 13, 21 | adhesive agent |
| 3 | sprocket holes |
| 4 | device holes |
| 5, 14, 22 | conductor for semiconductor integrated circuit connection |
| 6 | inner lead portion |
| 7 | outer lead portion |
| 8, 15, 23 | semiconductor integrated circuits |
| 9, 16, 24 | sealing resin |

-continued

| 10, 17, 25 | gold bumps |
|---|---|
| 11 | protective film |
| 18, 26 | solder balls |
| 19 | reinforcing board |
| 27 | solder resist |

Optimum Form for Practising the Invention

As examples of the insulating film used in the present invention, there are plastics such as polyimides, polyesters, polyphenylene sulphide, polyether sulphones, polyetherether ketones, aramids, polycarbonates, polyarylates and liquid crystal polymers, and also films which comprise a composite material such as a glass cloth impregnated with an epoxy resin. There may also be used a laminate of a plurality of these films. Amongst such examples, films in which the chief component is a polyimide resin are outstanding in their mechanical, electrical, heat resistance and chemical properties, etc, and provide a good balance too in terms of cost, so are favourably employed. Optionally, the insulating film can be subjected to a surface treatment by, for example, a hydrolysis, corona discharge, low temperature plasma, physical roughening or adhesion-enhancing coating treatment, on one or both faces.

The thickness of the insulating film is preferably 10–65 μm and more preferably 25–55 μm. If it is less than 10 μm, the mechanical strength is low and the usability in the patterning and subsequent stages is impaired, so this is undesirable. If it is more than 65 μm, it is difficult to reduce the size of solder balls and via holes, so this is undesirable.

The transverse direction (TD) coefficient of linear expansion of the film is preferably greater than the coefficient of linear expansion of the clad metal foil. The coefficient of linear expansion at 50–200° C. is preferably 17–30 ppm/° C. and more preferably 19–25 ppm/° C. in the case where the metal foil is an electrolytic copper foil. If it is less than 17 ppm/° C. or more than 30 ppm/° C., then there is considerable warping in the copper-foil-laminated state, which is undesirable.

The tensile modulus of elasticity in the present invention is the value at 25° C. defined by ASTM-D882. The tensile modulus of elasticity is preferably 6–12 GPa, and more preferably 7– 10 GPa. If it is less than 6 GPa, then the mechanical strength is low and the usability in the patterning and subsequent stages is impaired, which is undesirable. If it is higher than 12 GPa, then the flexibility is lowered which is undesirable.

With regard to the coefficients of linear expansion of the insulating film layer of the present invention in the film machine direction (MD) and transverse direction (TD), the difference between these coefficients of linear expansion is preferably 3–10 ppm/° C., and more preferably 5–7 ppm/° C. If the difference is less than 3 ppm/° C. or more than 10 ppm/° C., then in both cases there is considerable warping in the copper-foil-laminated state, which is undesirable. Again, in terms of achieving a good balance between the elongation due to tension in the MD direction at the time of continuous lamination and the elongation due to heat in the TD direction, it is preferred that the value in the MD be smaller than that in the TD. Reference here to the coefficient of linear expansion is the value measured by the TMA tensile loading method, and specifically it is the value given by evaluation method (2) of the examples.

The percentage heat shrinkage of the insulating film layer at 200° C. in the film transverse direction (TD) is preferably 0.0 to 0.2%, and more preferably 0.0 to 0.1%. The percentage heat shrinkage influences the warping in the copper-foil-laminated state in the same way as the coefficient of linear expansion, and if it is less than 0.0% or more than 0.2% then in each case there is considerable warping in the copper-foil-laminated state, which is undesirable. Reference here to the percentage heat shrinkage means the value measured by a method based on ASTM D1204, and is the value determined by the method given in evaluation method (3) of the examples.

The humidity coefficient of expansion of the insulating film layer in the film transverse direction (TD) is preferably no more than 23 ppm/% RH. More preferably, it is 5 to 20 ppm/% RH and still more preferably 5 to 15 ppm/% RH. In the same way as the coefficient of linear expansion, the humidity coefficient of expansion affects the warping in the copper-foil-laminated state and if the value exceeds 23 ppm/% RH then there is considerable warping in the copper-foil-laminated state, which is undesirable. The precise measurement conditions for the humidity coefficient of expansion are given in evaluation method (4) of the examples.

The water absorption of the insulating film layer is preferably no more than 1.7% and more preferably no more than 1.5%. If the percentage water absorption exceeds 1.7%, the amount of moisture vaporized by the heat of soldering at the time of the semiconductor device mounting is considerable so, for example, separation occurs between structural components of the TAB tape, and the soldering heat resistance is poor. The water absorption measurement conditions are given in evaluation method (5) of the examples.

The thermal conductivity of the insulating film layer is preferably no more than 0.40 W/m.K, and more preferably no more than 0.30 W/m.K. If the thermal conductivity exceeds 0.40 W/m.K, then the heat of soldering is transmitted to the insulating film layer and adhesive agent layer, so that moisture contained in the insulating film layer and in the adhesive agent layer is readily vaporized and caused to expand. As a result, separation occurs between the structural components of the TAB tape and there is poor solder heat resistance. The conditions for measuring the thermal conductivity are given in evaluation method (6) of the examples.

The water vapour transmission of the insulating film layer is preferably at least 0.04 g/m$^2$/24 hr. If the water vapour transmission is less than 0.04 g/m$^2$/24 hr, then moisture absorbed by the substrate does not escape when heating at the time of soldering, and there is explosive vaporization and expansion, so that separation of the structural components occurs. The conditions for measurement of the water vapour transmission are given in evaluation method (7) of the examples.

The adhesive agent layer is normally provided in a semi-cured state and its chemical structure is not particularly restricted providing that, following copper foil laminating, curing and crosslinking can be effected by the application of at least one type of energy selected from heat, pressure, an electric field, a magnetic field, ultraviolet light, radiation, ultrasonics or the like. In particular, it is preferred that it contain at least one type of thermosetting resin selected from epoxy resins, phenolic resins, polyimide resins and maleimide resins. The amount of thermosetting resin added is preferably 2 to 20 wt % of the adhesive agent layer and more preferably 4 to 15 wt %. The thickness of the adhesive agent layer prior to curing is preferably in the range 3 to 50 $\mu$m.

The epoxy resins are not especially restricted, providing that they possess two or more epoxy groups per molecule, and examples include the diglycidyl ethers of bisphenol F, bisphenol A, bisphenol S, dihydroxy-naphthalene, dicyclopentadiene diphenol, dicyclopentadiene dixylenol and the like, epoxidized phenolic novolaks, epoxidized cresol novolaks, epoxidized trisphenylol methane, epoxidized tetraphenylol ethane, epoxidized m-xylenediamine, cyclic epoxies and the like.

As phenolic resins, there can be used any known phenolic resin such as novolak type phenolic resins or resol type phenolic resins. For example, there are resins comprising phenol, alkyl-substituted phenols such as cresol, p-tert-butylphenol, nonylphenol and p-phenylphenol, terpene, dicyclopentadiene and other such cyclic alkyl-modified phenols, those with a functional group containing a heteroatom such as a nitro group, halogen group, cyano group, amino group or the like, those with a naphthalene, anthracene or similar skeletal structure, and polyfunctional phenols such as bisphenol F, bisphenol A, bisphenol S, resorcinol and pyrogallol.

As examples of polyimide resins, there are those obtained by the imidation of polyamic acids obtained by the polycondensation of the dianhydride of an aromatic tetracarboxylic acid such as pyromellitic acid, 3,3',4,4'-biphenyltetracarboxylic acid or 3,3',4,4'-benzophenonetetracarboxylic acid, and a diamine such as 4,4'-diaminodiphenylether, 4,4'-diaminodiphenyl-sulphone, p-phenylenediamine, dimethylbenzidine or 3,3'-diaminobenzophenone.

As maleimide resins, those which are at least difunctional are preferred, such as N,N'-(4,4'-diphenylmethane)bismaleimide, N,N'-p-phenylenebis-maleimide, N,N'-m-phenylenebismaleimide, N,N'-2,4-tolylenebismaleimide, N,N'-2,6-tolylenebismaleimide, N,N'-ethylenebismaleimide, N,N'-hexamethylenebis-maleimide and the like.

There are no particular restrictions on the addition of thermosetting resin curing agents and curing accelerators to the adhesive agent layer of the present invention. For example, there can be used known materials such as diethylenetriamine, triethylene-tetramine or other such aliphatic polyamines, aromatic polyamines, boron trifluoride triethylamine complex or other such boron trifluoride amine complexes, 2-alkyl-4-methylimidazole, 2-phenyl-4-alkylimidazole or other such imidazole derivative, phthalic anhydride, trimellitic anhydride or other such organic acid, dicyandiamide, triphenylphosphine, diazabicycloundecene or the like. The amount added is preferably from 0.1 to 10 parts by weight per 100 parts by weight of the adhesive agent layer.

As well as the above components, there are no restrictions on the addition of antioxidants, ion arrestors or other such organic or inorganic components within a range such that the properties of the adhesive agent are not impaired.

The adhesive agent layer of the present invention can contain thermoplastic resins. Thermoplastic resins are effective for controlling the softening temperature, and have the function of enhancing adhesive strength, flexibility, thermal stress mitigation, and insulation based on lower moisture absorption. The amount of thermoplastic resin added is preferably 30–60 wt %, and more preferably 35–55 wt %, of the adhesive agent layer.

Examples of thermoplastic resins are acrylonitrile-butadiene copolymer (NBR), acrylonitrile-butadiene rubber-styrene resin (ABS), styrene-butadiene-ethylene resin (SEBS), acrylics, polyvinyl butyral, polyamides, polyesteramides, polyesters, polyimides, polyamide-imides, polyurethanes and the like. Furthermore, these thermoplastic resins may also possess functional groups capable of reacting with the aforesaid phenolic resins, epoxy resins or other thermosetting resins. Specific examples of these groups are amino groups, carboxyl groups, epoxy groups, hydroxyl groups, methylol groups, isocyanate groups, vinyl groups, silanol groups and the like. By means of these functional groups, there is firm bonding to the thermosetting resin and the heat resistance is thereby raised, so this is preferred. Amongst the thermoplastic resins, polyamide resins are preferred in terms of adhesion to the copper foil, flexibility and insulation properties, and various kinds of polyamide resin can be used. Polyamide resins containing, as an essential component, dicarboxylic acid with 36 carbons (so-called dimer acid) are particularly suitable for conferring flexibility on the adhesive agent layer and, because of low moisture absorption, they are outstanding in their insulation properties. Furthermore, polyamide resins which are polyamide resins of amine value at least 1 but less than 3 are favourably employed. Polyamide resins containing dimer acid are obtained by the polycondensation of a diamine and dimer acid by the usual methods, and in such circumstances, as well as the dimer acid, there may also be included dicarboxylic acid such as adipic acid, azelaic acid or sebacic acid as a copolymer component. Known diamines such as ethylenediamine, hexamethylenediamine or piperazine can be used, and two or more types may be mixed together from the point of view of moisture absorption, solubility or the like.

In the present invention the acid value of the polyamide resin is calculated from the titre using potassium hydroxide. That is to say, 5 g of the polyamide is weighed out and dissolved in 50 ml of a 2:1 solvent mixture of toluene and n-butanol. A few drops of phenolphthalein are added as an indicator and then titration performed using a 0.1 N potassium hydroxide solution in methyl alcohol. The acid value is calculated using the following formula (1) from the amount of potassium hydroxide employed for the titration.

$$Av = (56.1 \times 0.1 \times F \times (A-B))/50 \qquad (1)$$

Av: acid value, F: strength[*1] of the potassium hydroxide, A: amount of potassium hydroxide solution required for the titration (ml), B: amount corresponding to A in a blank test (ml)

Here, the strength of the potassium hydroxide is calculated from the following formula (2) by potassium hydrogen phthalate titration.

$$F = 1000 \times 0.5/(204.22 \times (V-b) \times 0.1) \qquad (2)$$

V: amount of potassium hydroxide solution required in the titration (ml), b: amount corresponding to V in a blank test (ml)

An adhesive agent composed only using polyamide resin of acid value less than 3 is inferior in its punchability. In the present invention, it is preferred that there be at least 3 wt % of polyamide resin of acid value at least 3 in terms of the adhesive agent layer as a whole. This contributes to the punchability.

In the present invention, it is preferred that the proportion of polyamide resin contained in the adhesive agent layer lies in the range 1 to 90 wt %. If the amount is less than 1 wt %, problems are produced in terms of pliability, and there is a fear that the adhesive agent layer will separate away. With more than 90 wt %, the insulation properties are impaired, so the reliability is reduced. It is further preferred that the amount lies in the range 20–70 wt %.

Following curing, the elastic modulus at 150° C. of the adhesive agent layer in the film transverse direction (TD) is preferably from 1 MPa to 5 GPa, more preferably from 2 MPa to 1 GPa, and still more preferably from 50 MPa to 1 GPa, and furthermore, the coefficient of linear expansion at 25–150° C. in the film transverse direction (TD) is preferably in the range 10–500 ppm/° C. and more preferably 20–300 ppm/° C. Here, reference to the elastic modulus denotes the value E' (the storage elastic modulus) determined by a dynamic visco-elasticity method, and the measurement conditions are given in evaluation method (8) of the examples. If the elastic modulus is less than 1 MPa, then there is a lowering of the heat resistance at the time of reflow, which is undesirable. If the elastic modulus is greater than 5 GPa, as well as there being insufficient flexibility, there is considerable warping following the circuit pattern formation, which is undesirable.

Now, a high elastic modulus at high temperature is, more important in a semiconductor connecting substrate for wire bonding applications. Specifically, wire bonding temperatures are generally from 110° C. to 200° C. and taking, as a typical value, the elastic modulus (E' determined by the dynamic viscoelasticity method) at 150° C. as an index, this should appropriately lie in the range given above.

Again, the elastic modulus at 25° C. of the adhesive agent layer in the film transverse direction (TD) after curing preferably lies in the range 10 MPa to 5 GPa, and more preferably in the range 100 MPa to 3 GPa. If the elastic modulus is less than 10 MPa, then punching faults arise and the punchability is reduced, so this is undesirable. If the elastic modulus is greater than 5 GPa, then the adhesive strength to the copper foil is reduced, which is undesirable.

Furthermore, it is preferable that the coefficient of linear expansion in the film transverse direction (TD) at 25–150° C. lies in the range 10–500 ppm/° C. and more preferably in the range 20–300 ppm/° C. If the coefficient of linear expansion is less than 10 ppm/° C., or greater than 500 ppm/° C., then warping is increased which is undesirable. The method of measuring the coefficient of linear expansion is given in evaluation method (9) of the examples.

Again, the haze value of the adhesive agent layer is preferably no more than 20. If the haze is more than 20, then the wire bonding properties are poor. Here haze refers to the cloudiness and is specified in JIS K7105, but the details are given in evaluation method (10) of the examples.

The adhesive-backed tape for semiconductor devices of the present invention may have a protective film layer. The protective film layer is not particularly restricted providing that it can be peeled away from the adhesive agent surface prior to the hot lamination of the copper foil without adversely affecting the form of the adhesive-backed tape. However, as examples, there are silicone- or fluorocompound-coated polyester film or polyolefin film, or paper to which these have been laminated.

Next, the method of producing a copper-clad laminate, a semiconductor connecting substrate and a semiconductor device using the adhesive-backed tape of the present invention will be exemplified.

(1) Example of a Method for Producing the Adhesive-Backed Tape

A coating material comprising an aforesaid adhesive agent composition dissolved in a solvent is applied onto an insulating film such as a polyimide which meets the requirements of the present invention, and then dried. It is preferred that the application be carried out so that there is formed an adhesive agent layer film thickness of 5 to 125 μm. The drying conditions are preferably 1 to 5 minutes at 100–200° C. The solvent is not particularly restricted but a solvent mixture of an aromatic such as toluene or xylene and an alcohol such as methanol or ethanol is favourably employed.

In the case where an epoxy resin and a polyamide resin are mixed together, the compatibility is generally poor and the haze value of the adhesive agent is raised. In the present invention, when an epoxy resin and polyamide resin are dissolved in a solvent, it is possible to improve the compatibility and reduce the haze to no more than 20 by stirring in the solvent for 2–4 hours at 60–70° C. prior to employing other components, so that there is partial prior reaction between said epoxy resin and polyamide resin.

A protective film is laminated to the film obtained in this way, and then finally the film is slit to a specified width and the adhesive-backed tape obtained.

Furthermore, by coating a solution of the adhesive agent composition onto a protective film such as polyester film which has been provided with release properties, and then drying, after which this is slit to the specified width of 29.7–60.6 mm, and the adhesive-backed tape thus obtained then hot roll laminated under conditions comprising 100–160° C., 10 N/cm and 5 m/min, to the centre of an insulating film of specified width 35–70 mm, this may also be employed as adhesive-backed tape for TAB use.

(2) An Example of the Method for Producing a Copper-Clad Laminate

3–35 μm electrolytic or rolled copper foil is laminated to the adhesive-backed tape sample from (1) under conditions comprising 110–180° C., 30 N/cm and 1 m/min. Where required, a stepwise hot curing treatment is carried out for 1 to 24 hours at 80–300° C. in an air oven and the copper-clad laminate produced. In such circumstances, device holes and solder ball holes may be introduced into the adhesive-backed tape sample prior to the copper-foil cladding.

(3) An Example of the Method for Producing a Semiconductor Connecting Substrate

In the normal way, a photoresist film is formed on the copper foil surface of the copper-clad laminate obtained in (2), and then etching, removal of the resist, electrolytic gold plating and solder resist film formation carried out, and a semiconductor connecting substrate (patterned tape) produced (FIG. 1).

(4) An Example of the Method for Producing a Semiconductor Device

Figure 2:
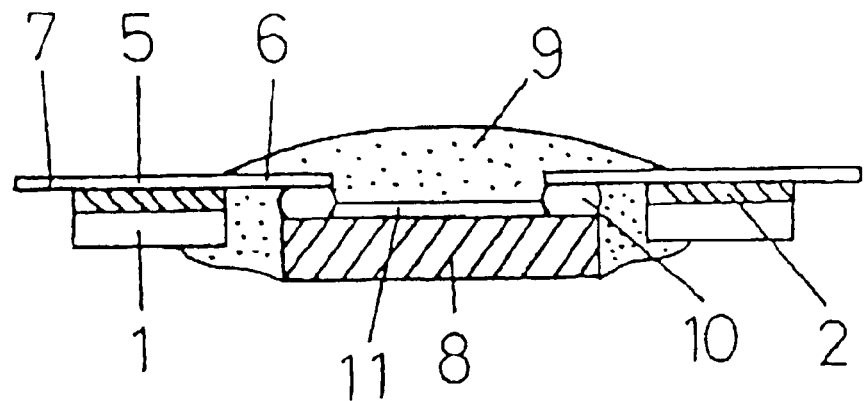
FIG. 2 shows, a cross-sectional view of an embodiment of a semiconductor device (TCP) using the adhesive-backed tape for semiconductor devices of the present invention.
Figure 3:
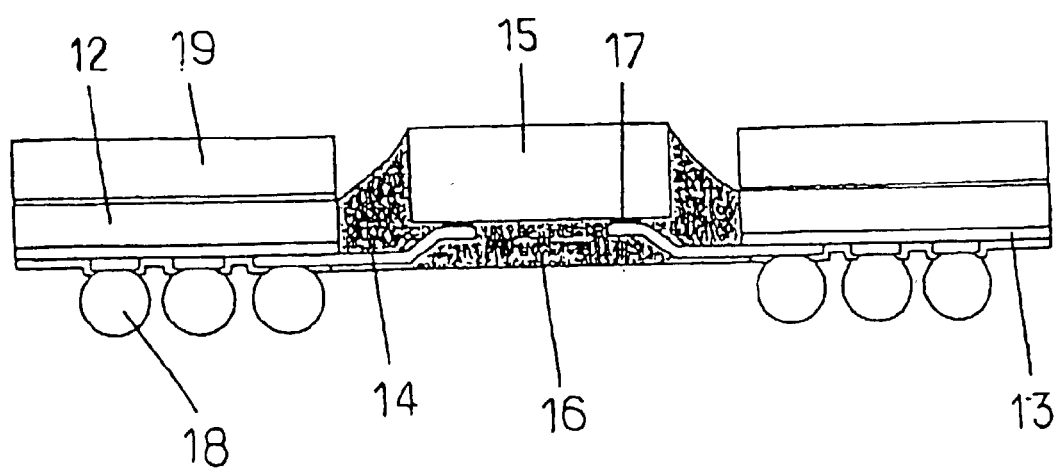
FIG. 3 shows a cross-sectional view of an embodiment of a semiconductor device (BGA) using the adhesive-backed tape for semiconductor devices of the present invention.
Figure 4:
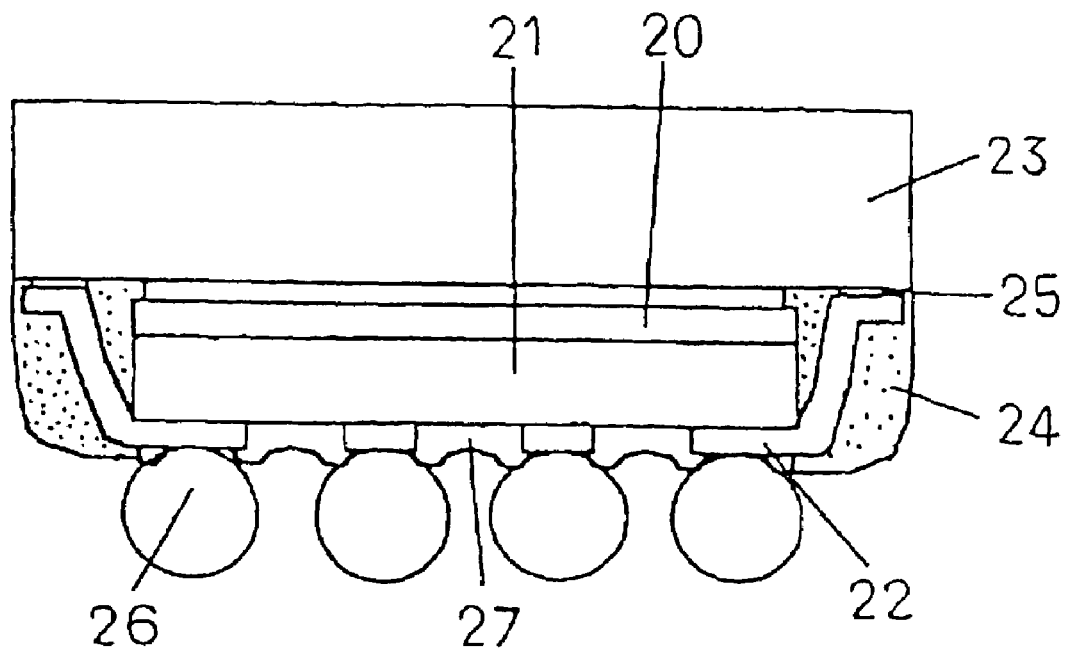
FIG. 4 shows a cross-sectional view of an embodiment of a semiconductor device (CSP) using the adhesive-backed tape for semiconductor devices of the present invention.

First of all, an integrated circuit (IC) is connected onto the patterned tape from (3) using an epoxy type die-bond material. Furthermore, die bonding is carried out for 3 seconds at 110–250° C. on the reverse face and, optionally, the die-bond material is cured. Next, under conditions comprising 110–200° C. and 60–110 kHz, wirebonding connection is effected. Finally, by sealing based on an epoxy sealing resin and solder ball connection stages, an FP-BGA type semiconductor device is obtained (FIG. 2). As the die-bond material, there may also be used adhesive tape with 10–100 μm adhesive agent layers on both faces of an insulating film such as polyimide which satisfies the requirements of the present invention. In such circumstances, the press bonding onto the patterned tape and the IC press bonding are preferably carried out for about 0.5 to 5 seconds at 80–200° C. Again, following the press bonding, where required a stepwise hot curing treatment may be carried out for 1–24 hours at 80–300° C., and the adhesive agent cured.

Below, the present invention is explained by providing practical examples but the invention is not to be restricted to these examples. Prior to embarking on the explanation of the examples, the methods of evaluation will first be described.

(1) Tensile Modulus of Elasticity

This was measured based on ASTM-D882.

(2) Coefficient of Linear Expansion

A test-piece, which had been heated for 30 minutes at 300° C. in a state permitting free shrinkage, was fitted to a TMA device, and the dimensional change in the test-piece over the range 50–200° C. read off under conditions of 2 g load and 20° C./min rate of temperature rise, after which calculation was carried out using the following formula.

$$\text{linear expansion coefficient } (1/° C.) = (L_1 - L_0)/L_0(200-50)$$

$L_0$: length of test-piece at 50° C. (mm)
$L_1$: length of test-piece at 200° C. (mm)

(3) Percentage Heat Shrinkage

This was calculated by the following formula.

$$\text{percentage heat shrinkage } (\%) = (L_1 - L_2) \times 100/L_1$$

$L_1$: length between marks prior to heating (mm)
$L_2$: length between marks after heating (mm)

(4) Humidity Coefficient of Expansion

The dimensional change in a test-piece over the range 5–60% RH, measured at a temperature of 23° C. with a 5 g loading, was determined and calculation carried out using the following formula.

$$\text{Humidity coefficient of expansion } (1/\% RH) = (L_1 - L_0)/L_0(60-5)$$

$L_0$: length of test-piece at 5% RH (mm)
$L_1$: length of test-piece at 60% RH (mm)

(5) Water Absorption

The insulating film layer was immersed in water at 23° C. for 24 hours, and the change in weight of the insulating film layer before and after immersion measured, and then calculation carried out using the following formula.

$$\text{water absorption } (\%) = (\text{weight after immersion} - \text{weight before immersion})/\text{weight before immersion}$$

(6) Thermal Conductivity

The calculation of the thermal conductivity was carried out using the following formula.

$$\text{thermal conductivity } (W/m.K) = \text{heat diffusivity } (m^2/s) \times \text{heat capacity } (J/m^3K)$$

The heat diffusivity was measured by cutting out a disc-shaped sample of diameter about 10 mm and thickness 50 μm, then coating both faces by sputtering platinum, after which both faces were given about a 1 μm coating with a carbon spray to blacken the faces, and then measurement carried out by the laser flash method at 150° C.

The heat capacity was calculated from the product of the density and the specific heat. The density was measured by the Archimedes method at 23° C. The specific heat was measured by DSC (Differential Scanning Calorimetry) at a rate of temperature rise of 10° C./min, and there was employed the specific heat measured at 150° C.

(7) Water Vapour Transmittance

This was measured based on ASTM-D50 under conditions of 38° C./90% RH for 24 hours.

(8) Elastic Modulus of the Adhesive Agent

Layers of adhesive agent were superimposed to give a thickness of about 200 μm, and then a sequential curing treatment carried out for 4 hours at 80° C., 5 hours at 100° C. and 4 hours at 160° C. in an air oven, and a cured film of the adhesive obtained. Using a dynamic viscoelasticity method, the change in E' (storage elastic modulus) with temperature was measured. The measurement conditions were as follows.

frequency=110 Hz
rate of temperature rise=3° C./min

(9) Coefficient of Linear Expansion of the Adhesive Agent

A film of cured adhesive agent was prepared in the same way as in (8) and used as the test-piece. This was fitted to a TMA device and the dimensional change in the test-piece over the range 25–150° C. read-off under conditions of 2 g loading and 20° C./min rate of temperature rise, after which calculation was performed using the following formula.

$$\text{linear expansion coefficient } (1/°C.) = (L_1-L_0)/L_0(150-25)$$

$L_0$: length of test-piece at 25° C. (mm)
$L_1$: length of test-piece at 150° C. (mm)

(10) Adhesive Agent Haze

There was used as the measurement sample an adhesive agent sheet comprising a PET film of thickness 25 µm on which had been coated a 12 µm adhesive agent layer. Furthermore, as a reference sample, there was used the uncoated PET film (25 µm). In accordance with JIS-K7105, using an integrating sphere type luminous transmission measurement device, the diffuse transmittance and the total luminous transmittance were measured. The haze (ratio of diffuse transmittance to total luminous transmittance) for the reference sample was determined and taken as 0 (standard). Next, the diffuse transmittance and total luminous transmittance of the adhesive sheet were measured, and the haze for just the adhesive agent layer alone determined.

(11) Production of the Semiconductor Connecting Substrate (Patterned Tape) for Evaluation 18 µm of electrolytic copper foil (FQ-VLP foil made by the Mitsui Mining and Smelting Co.) was laminated to the adhesive-backed tape under conditions of 140° C., 10 N/cm and 1 m/min, and, then a sequential hot curing treatment carried out in an air oven for 4 hours at 80° C., 5 hours at 100° C. and 4 hours at 160° C., to give a copper-foil-laminated adhesive-backed tape.

Furthermore, in the normal way, photoresist film formation, etching, removal of the resist, electrolytic gold plating and solder resist film formation were carried out, to prepare a semiconductor connecting substrate (patterned tape) having a 3 µm thickness of plated nickel and a 1 µm thickness of plated gold (FIG. 1).

(12) Production of the Semiconductor Device

A 20 mm square IC was press bonded onto the patterned tape prepared in (11) using an epoxy die-bonding material ("LE-5000" produced by Lintech), and then hot curing carried out for 30 minutes at 160° C. in this state. Next, after wire bonding the IC and circuit board with gold wire under conditions of 150° C. and 110 kHz, resin sealing was performed. Finally, the solder balls were attached by reflow and the semiconductor device used for evaluation obtained.

(13) Preparation of the Sample used for the Copper-Foil-Lamination Warping Evaluation and the Warping Evaluation Method 18 µm electrolytic copper foil was laminated to the adhesive-backed tape under conditions of 140° C., 30 N/cm and 1 m/min. Next, the sample was cut to a width of 35 mm×200 mm and a sequential curing treatment carried out in an air oven for 4 hours at 80° C., 5 hours at 100° C. and 4 hours at 160° C., and the sample used for evaluation of the warping obtained. The measurement of warping was carried out after conditioning for 24 hours at 23° C. and 55% RH based on SEMI-G76-0299. With one edge of the sample pressed down, using vernier callipers the height on the other side of an upwardly warping sample was measured and this was taken as the amount of warping (where the copper foil curved upwards, this was taken as plus).

(14) Method of Evaluating Warping in the State with a Circuit Pattern Formed In the normal way, the copper foil side of the warping evaluation sample produced in (13) was subjected to photoresist film formation, etching, resist elimination and electrolytic gold plating, and an evaluation sample produced. When the area of the adhesive was taken as 100, the area of the conductor regions (the residual fraction) was 30. The measurement of the warping was carried out in the same way as in (13).

(15) Method of Evaluating the Percentage Dimensional Change

Sprocket holes and device holes were introduced into the adhesive-backed tape. Two arbitrary points A and B were taken on this tape and the distance between them measured ($L_0$). Next, patterned tape was produced by the procedure in (11) and the distance (L) between A and B measured. The percentage dimensional change was determined from the following formula. Percentage dimensional change= $\{(L_0-L)/L_0\} \times 100$

(16) Wire Bonding Property (WB Property, Pull Strength)

Under conditions of 135° C. and 0.1 MPa, 18 µm electrolytic copper foil was laminated to the adhesive-backed tape used for semiconductor devices. Next, sequential heat treatment was carried out in an air oven for 3 hours at 80° C., 5 hours at 100° C. and 5 hours at 150° C., and there was produced a copper-foil-laminated adhesive agent sheet for semiconductor devices. A 2 mm wide protective tape was affixed to the copper foil face of the copper-foil-laminated adhesive agent sheet obtained, then etching and removal of the protective tape performed, after which nickel plating was carried out at a thickness of 1 µm, and then electrolytic gold plating carried out at a thickness of 0.5 µm. Bonding of gold wire to the sample produced was carried out under the following conditions.

| | |
|---|---|
| gold wire diameter | 25 µm |
| ultrasonic frequency | 110 KHz |
| bonding temperature | 150° C. |

Subsequently, using a push-pull gauge, the pull strength between the gold wire and the sample was measured. The higher the pull strength the better but if it is less than 7 g then, in the temperature cycle test, wire break faults will readily occur, so it is ideally greater than 7 g.

(17) Punchability

Using a metal die, a round hole (0.3 mm diameter) was introduced from the protective film side into a sample of the adhesive agent sheet with a protective film/adhesive agent layer/organic insulating film structure. Next, after the protective film had been removed, the condition of the adhesive agent layer at the hole circumference was observed. Where there were splits or gaps in adhesive agent layer, or where there was separation from the organic insulating film, the punchability was regarded as poor.

(18) Solder Heat Resistance (Reflow Resistance)

Five semiconductor devices for evaluation prepared in (12) were conditioned for 12 hours at 85° C./85% RH, after which heat treatment was carried out in an IR reflow oven at a maximum temperature of 240° C. A check was made for the number of occurrences of package bulging.

Below, the present invention is explained by providing examples but the invention is not to be restricted to these examples. With regard to the polyamide resins and polyimide base film used in these examples, besides the commercial materials, materials were also prepared by the methods exemplified below.

REFERENCE EXAMPLE 1

Synthesis of Polyamide Resins

Using dimer acid ("Pripol 1009", produced by Uniqema) and adipic acid as the acid component, and using hexamethylenediamine as the amine component, polyamide reaction product were prepared by adding together mixtures of these acids/amine, antifoaming agent and up to 1% phosphoric acid catalyst. These were subjected to thermal polymerization at 205° C. and, following standard procedure, antioxidant then added, after which the polyamide resin was removed. The four types of polyamide resin shown in Table 1 were obtained by suitable adjustment of the acid/amine component ratio and the polymerization time.

REFERENCE EXAMPLE 2

Synthesis of the Base Film

Using N,N-dimethylacetamide as the solvent, equimolar proportions of 3,3',4,4'-biphenyltetracarboxylic acid dianhydride and p-phenylenediamine were added, and a polyamic acid solution obtained by reaction for about 10 hours. After forming a coated film by casting this solution on a glass plate, drying was carried out by supplying hot air at 130° C. to the surface for 60 seconds. The film was then separated away and a self-supporting film obtained. This film was held in a frame and subjected to heat-treatment at 200° C. to 450° C. and, in this way, there was obtained polyimide films A–H, K and M with properties as shown in Table 3. Table 3 should be read as if it is a continuation of Table 2 extending downwards. That is, for example, the base film A, shown in the first column of data of Table 3, was formed by the polymerization of the composition of Example 1 in Table 2.

Furthermore, pyromellitic acid dianhydride, 3,3',4,4'-biphenyltetracarboxylic acid dianhydride, p-phenylenediamine and 4,4'-diaminodiphenyl ether were added together at a ratio of 20/80/50/50 and, by the same procedure, polyimide film L was prepared having the properties shown in Table 3.

The other base films described in Table 3 were as follows.
I: There was employed Upilex 75S produced by Ube Industries, after polishing with a grinder to an average thickness of 60 μm.
J: There was employed Upilex 125S produced by Ube Industries, after polishing with a grinder to an average thickness of 55 μm.
N: There was employed Kapton 200EN produced by Toray-DuPont.
O: There was used 20 μm Micton produced by Toray Industries.
P: There was used 50 μm BIAC produced by Japan Goretex.
Q: There was used Upilex 50S produced by Ube Industries.
R: There was used Kapton 200V produced by Toray-DuPont.
S: There was used Upilex 75S produced by Ube Industries.

EXAMPLES 1–10, 12, 14–21, COMPARATIVE EXAMPLES 1 AND 2

The polyamide resins prepared in Reference Example 1 and the other starting materials shown in Table 1 were dissolved in the proportions shown in Table 2 in a solvent mixture of methanol/monochlorobenzene at a solids concentration of 20 wt %, and adhesive agent solutions prepared. First of all, the polyamide resin was stirred for 5 hours at 70° C., then the epoxy resin was added and stirring continued for a further 3 hours. Next, the solution temperature was reduced to 30° C. and, while stirring, the phenolic resin and curing accelerator were added in turn and stirring carried out for 5 hours, to produce the adhesive agent solution.

Using a bar coater, the adhesive agent solution was applied, so as to give a thickness after drying of about 12 μm, onto polyethylene terephthalate film (Lumirror, produced by Toray Industries) of thickness 25 μm as a protective film, then drying carried out for 1 minute at 100° C. and 5 minutes at 160° C., to prepare adhesive agent sheets I, II, III and V. Furthermore, the adhesive agents sheets obtained were laminated under conditions of 120° C. and 0.1 MPa to the polyimide films A–H, K, L and M prepared in Reference Example 2, and to aforesaid films N, I, J, R and S. and also to aramid film O and liquid crystal polymer film P, and adhesive-backed tapes produced. Table 3 show the combinations of adhesive agent sheet and polyimide film, and the properties of the adhesive-backed tapes obtained. Next, by the methods described in aforesaid Evaluation Methods (11) to (16), patterned tape and semiconductor device preparation and evaluation were carried out. The results are shown in Table 3.

EXAMPLE 11

90 parts of (3-aminopropyl)tetramethyldisiloxane, 10 parts of p-phenylenediamine and 100 parts of 3,3',4,4'-benzophenonetetracarboxylic acid anhydride were dissolved in N,N-dimethylacetamide, and a polyamic acid solution obtained. Using a bar coater, this solution was applied onto the base film shown in Example 1 so as to give a thickness of 8 μm after drying, and then drying performed at 80–150° C., followed by a 30 minute heat treatment at 250° C., and the adhesive-backed tape obtained.

As the base film, there was employed the polyimide film A prepared in Reference Example 2.

Under conditions of 230° C., 10 N/cm and 1 m/min, 18 μm electrolytic copper foil (FQ-VLP foil produced by the Mitsui Mining and Smelting Co.) was laminated to this adhesive-backed tape, and then a sequential hot curing treatment carried out in an inert gas atmosphere oven at 100° C. for 4 hours, 160° C. for 4 hours and 270° C. for 2 hours, and a copper-foil-laminated adhesive-backed tape obtained. Next, by the usual methods, photoresist film formation, etching, resist removal, electrolytic gold plating and solder-resist film formation were carried out, and there was produced a semiconductor connecting substrate (patterned tape) of nickel plating thickness 3 μm and gold plating thickness 1 μm (FIG. 1). The properties of the patterned tape are shown in Table 3.

Furthermore, using the patterned tape thus produced, a semiconductor device for evaluation was obtained in accordance with aforesaid evaluation method (12). The properties of the semiconductor device obtained are shown in Table 3.

EXAMPLE 13

40 parts of polyamide resin II prepared in Reference Example 1, 10 parts of bisphenol A type epoxy resin ('Epikote 828' produced by Yuka Shell Epoxy), 10 parts of trifunctional bisphenol A type epoxy resin "VG3101", produced by the Mitsui Chemical Co.), 27 parts of tert-butylphenol resol resin ('Hitanol 2442' produced by the Hitachi Chemical Co.) and 15 parts of N,N'-(4,4'-diphenylmethane)bismaleimide were blended, and then mixed and stirred together at 30° C. in a methanol/monochlorobenzene mixed solvent to give a concentration of 20 wt%, and the adhesive agent solution prepared. Using the method described above, adhesive sheet was prepared from this adhesive agent solution. Furthermore, using the polyimide film A prepared in Reference Example 2, an adhesive-backed tape, patterned tape and a semiconductor device were prepared by the aforesaid methods. The properties obtained are shown in Table 3.

EXAMPLES 22–30, COMPARATIVE EXAMPLES 3–7

The polyamide resins prepared in Reference Example 1 and the other starting materials indicated in Table 1 were dissolved in the proportions shown in Table 2 in a solvent mixture of methanol/monochlorobenzene to give a solids concentration of 20 wt %, and adhesive agent solutions prepared. First of all, the polyamide resin was stirred for 5 hours at 70° C., then the epoxy resin was added and stirring continued for a further 3 hours. Next, the solution temperature was reduced to 30° C. and, while stirring, the phenolic resin and curing accelerator were added in turn and stirring carried out for 5 hours, to produce the adhesive agent solution.

Using a bar coater, the adhesive agent solution was applied, so as to give a thickness following drying of about 18 $\mu$m, on polyethylene terephthalate film (Lumirror, produced by Toray Industries) of thickness 25 $\mu$m as a protective film, then drying carried out for 1 minute at 100° C. and 5 minutes at 160° C., to prepare the adhesive agent sheet.

The adhesive agent sheet obtained was laminated under identical conditions to the polyimide film A prepared in Reference Example 2, and an adhesive-backed tape produced. The properties of the adhesive-backed tape obtained are shown in Table 3. Next, a patterned tape and semiconductor device were prepared and evaluated by the aforesaid methods. The results are shown in Table 3.

From the examples and comparative examples shown in Table 3, it can be seen that in the case of the adhesive-backed tape for semiconductors obtained in accordance with the present invention there is a reduction in warping after copper foil lamination and circuit pattern formation and, furthermore, both excellent wire bonding and punching properties are provided. Again, high dimensional stability and the pull strength following semiconductor device formation can be maintained at high levels and, moreover, outstanding solder heat resistance may be said to be shown.

INDUSTRIAL UTILIZATION POTENTIAL

The present invention offers, on an industrial basis, an adhesive-backed tape suitable for the production of semiconductor devices where there is employed a film-form adhesive agent such as in the case of the patterned tape used in tape automated bonding (TAB), the semiconductor connecting substrate such as an interposer used for a ball grid array (BGA) package, die bonding materials, lead frame fixing tape, LOC tape, the interlayer adhesive sheets of a multilayer substrate and the like, employed when mounting semiconductor integrated circuits; and to a copper-clad laminate, semiconductor connecting substrate and semiconductor device employing same. By means of the present invention the reliability of semiconductor devices used for high density mounting can be enhanced.

TABLE 1

| | Type | Product Name | Manufacturer | Structure | Notes |
|---|---|---|---|---|---|
| Polyamide | I | | | | acid value 1, MWt = 100,000 |
| | II | Synthesized in Reference | | | acid value 9, MWt = 20,000 |
| | III | Example 1 | | | acid value 20, MWt = 10,000 |
| | IV | | | | acid value 40, MWt = 5,000 |
| Epoxy Resin | I | Epikote 807 | Yuka Shell Epoxy K.K. | | exopy equivalent 170 |
| | II | Epikote 828 | Yuka Shell Epoxy K.K. | bisphenol A type epoxy | exopy equivalent 186 |
| | III | Epotohto YDC-1312 | Tohto Kasei Co. | di-tert-Bu-diglycidylether benzene expoxy | exopy equivalent 175 |
| | IV | Epotohto-ZX-1257 | Tohto Kasei Co. | dicyclopentadiene epoxy | exopy equivalent 257 |
| | V | EOCN-6000 | Nippon Kayaku Co | | exopy equivalent 205 |
| | VI | Epikote 152 | Yuka Shell Epoxy K.K. | phenol novolak type expoxy | |
| | VII | VG3101 | Mitsui Chemical Co. | trifunctional bisphenol A type epoxy | |
| Phenolic Resin | I | CKM1634 | Shikoku Chemicals Corp. | tert-butylphenol resol | |
| | II | CKM1634G | Showa High Polymer Co. | tert-butylphenol resol | |
| | III | PS2780 | Gun-Ei Chemical Ind. | p-tert-butylphenol resol | |
| | IV | PSM4326 | Gun-Ei Chemical Ind. | novolak type phenol | |
| | V | PR912 | Sumitomo Durez Co. | cresol type resol | |
| | VI | PL4414 | Gun-Ei Chemical Ind. | bisphenol A type resol | |
| | VII | H-1 | Meiwa Chemical Ind. | cresol novolak phenol | |
| | VIII | Hitanol 2442 | Hitachi Chemical Co. | tert-butylphenol resol | |
| Curing Accelerator | | 2-undecylimidazole | | | |

TABLE 2

| Adhesive Composition | type | 1 | 2 | 3 | 4 | 5 | 6 | 7 | 8 | 9 | 10 | 11 | 12 |
|---|---|---|---|---|---|---|---|---|---|---|---|---|---|
| Polyamide | I | 30 | 30 | 30 | 30 | 30 | 30 | 30 | 30 | | 45 | | 35 |
| | II | | | | | | | | | 45 | | | |
| | III | 10 | 10 | 10 | 10 | 10 | 10 | 10 | 10 | | | | |
| | IV | | | | | | | | | | | | |
| Epoxy Resin | I | | | | | | | | | | | | |
| | II | | | | | | | | | 0.5 | 10.0 | | |
| | III | 5 | 5 | 5 | 5 | 5 | 5 | 5 | 5 | | | | |
| | IV | 15 | 15 | 15 | 15 | 15 | 15 | 15 | 15 | | | | |
| | V | | | | | | | | | | | | |
| | VI | | | | | | | | | | | 10.0 | |
| | VII | | | | | | | | | | | | |
| Phenolic Resin | I | 40 | 40 | 40 | 40 | 40 | 40 | 40 | 40 | | | | |
| | II | | | | | | | | | 15 | | | |
| | III | | | | | | | | | | 25 | | |
| | IV | | | | | | | | | | 10 | | |
| | V | | | | | | | | | | | | 65 |
| | VI | | | | | | | | | | | 15 | |
| | VII | | | | | | | | | | | 15 | |
| | VIII | | | | | | | | | | | | |
| Curing Accelerator | | 0.3 | 0.3 | 0.3 | 0.3 | 0.3 | 0.3 | 0.3 | 0.3 | | | | |

| Adhesive Composition | type | 13 | 14 | 15 | 16 | 17 | 18 | 19 | 20 | 21 | 22 | 23 | 24 |
|---|---|---|---|---|---|---|---|---|---|---|---|---|---|
| Polyamide | I | | 30 | 30 | 30 | 30 | 30 | 30 | 30 | 30 | | | |
| | II | | | | | | | | | | 40 | | |
| | III | | 10 | 10 | 10 | 10 | 10 | 10 | 10 | 10 | | 40 | |
| | IV | | | | | | | | | | | | 40 |
| Epoxy Resin | I | | | | | | | | | | | | |
| | II | | | | | | | | | | 19.7 | 19.7 | 19.7 |
| | III | | 5 | 5 | 5 | 5 | 5 | 5 | 5 | 5 | | | |
| | IV | | 15 | 15 | 15 | 15 | 15 | 15 | 15 | 15 | | | |
| | V | | | | | | | | | | | | |
| | VI | | | | | | | | | | | | |
| | VII | | | | | | | | | | | | |
| Phenolic Resin | I | | 40 | 40 | 40 | 40 | 40 | 40 | 40 | 40 | 40 | 40 | 40 |
| | II | | | | | | | | | | | | |
| | III | | | | | | | | | | | | |
| | IV | | | | | | | | | | | | |
| | V | | | | | | | | | | | | |
| | VI | | | | | | | | | | | | |
| | VII | | | | | | | | | | | | |
| Curing Accelerator | | | 0.3 | 0.3 | 0.3 | 0.3 | 0.3 | 0.3 | 0.3 | 0.3 | 0.3 | 0.3 | 0.3 |

| Adhesive Composition | type | 25 | 26 | 27 | 28 | 29 | 30 | Comp Ex 1 | Comp Ex 2 | 3 | 4 | 5 | 6 | 7 |
|---|---|---|---|---|---|---|---|---|---|---|---|---|---|---|
| Polyamide | I | 30 | 30 | 30 | 30 | 30 | 30 | 30 | 30 | 40 | 40 | 30 | 30 | |
| | II | | | | | 10 | 10 | | | | | | | |
| | III | | | | | | | 10 | 10 | | | | | |
| | IV | 10 | 10 | 10 | 10 | | | | | | | 10 | 10 | 40 |
| Epoxy Resin | I | | | | | | | | | 19.7 | | 19.7 | | |
| | II | 19.7 | | | | | | | | | 19.7 | | | 19.7 |
| | III | | 19.7 | | 5 | 5 | | 5 | 5 | | | | | |
| | IV | | | 19.7 | 14.7 | 14.7 | 14.7 | 15 | 15 | | | | | |
| | V | | | | | | 5 | | | | | | 19.7 | |
| | VI | | | | | | | | | | | | | |
| | VII | | | | | | | | | | | | | |
| Phenolic Resin | I | 40 | 40 | 40 | 40 | 40 | 40 | 40 | 40 | 40 | 40 | 40 | 40 | 40 |
| | II | | | | | | | | | | | | | |
| | III | | | | | | | | | | | | | |
| | IV | | | | | | | | | | | | | |
| | V | | | | | | | | | | | | | |
| | VI | | | | | | | | | | | | | |
| | VII | | | | | | | | | | | | | |
| | VIII | | | | | | | | | | | | | |
| Curing Accelerator | | 0.3 | 0.3 | 0.3 | 0.3 | 0.3 | 0.3 | 0.3 | 0.3 | 0.3 | 0.3 | 0.3 | 0.3 | 0.3 |

TABLE 3

| Base Film Properties | | | | | | | | | | | | | |
|---|---|---|---|---|---|---|---|---|---|---|---|---|---|
| type | | A | B | C | D | E | F | G | H | A | A | A | A |
| thickness (μm) | | 50 | 50 | 50 | 50 | 50 | 50 | 50 | 50 | 50 | 50 | 50 | 50 |
| coefficient of linear expansion (ppm/°C.) | MD | 16 | 14 | 12 | 10 | 9 | 21 | 19 | 16 | 16 | 16 | 16 | 16 |
| | TD | 21 | 18 | 17 | 17 | 17 | 25 | 23 | 25 | 21 | 21 | 21 | 21 |
| | TD-MD | 5 | 4 | 5 | 7 | 8 | 4 | 4 | 7 | 5 | 5 | 5 | 5 |
| tensile elastic modulus [MPa] | TD | 7.9 | 8.0 | 9.6 | 7.4 | 9.4 | 8.5 | 8.5 | 6.5 | 7.9 | 7.9 | 7.9 | 7.9 |
| heat shrinkage [%] | TD | 0.01 | 0.03 | 0.05 | 0.05 | 0.06 | 0.01 | 0.00 | 0.01 | 0.01 | 0.01 | 0.01 | 0.01 |
| humid coef. of exp [ppm/°C.] | TD | 8.3 | 8.5 | 9.2 | 9.2 | 8.5 | 8.3 | 8.3 | 8.5 | 8.5 | 8.5 | 8.5 | 8.5 |
| water absorption [%] | TD | 1.4 | 1.3 | 1.4 | 1.5 | 1.3 | 1.3 | 1.4 | 1.3 | 1.4 | 1.4 | 1.4 | 1.4 |
| thermal conductivity [W/m · K] | | 0.28 | 0.28 | 0.30 | 0.26 | 0.29 | 0.28 | 0.30 | 0.31 | 0.28 | 0.28 | 0.28 | 0.28 |
| water vapour transmittance [g/m2/24 h] | | 0.04 | 0.05 | 0.05 | 0.06 | 0.04 | 0.06 | 0.05 | 0.05 | 0.04 | 0.04 | 0.04 | 0.04 |
| Adhesive Agent Props | | | | | | | | | | | | | |
| hase | | 3 | 3 | 3 | 3 | 3 | 3 | 3 | 3 | 37 | 19 | 10 | 50 |
| elastic modulus [MPa] | 25° C. 110 Hz | 1100 | 1100 | 1100 | 1100 | 1100 | 1100 | 1100 | 1100 | 300 | 1050 | 4000 | 2500 |
| | 150° C. 110 Hz | 135 | 135 | 135 | 135 | 135 | 135 | 135 | 135 | 60 | 10 | 900 | 85 |
| coef. linear expansion [ppm/°C.] | | 105 | 105 | 105 | 105 | 105 | 105 | 105 | 105 | 100 | 110 | 20 | 75 |
| Sample Properties | | | | | | | | | | | | | |
| copper laminated warping [mm] | | 2.8 | 2.5 | 2.4 | 2.9 | 3.0 | 2.3 | 2.0 | 2.0 | 3.0 | 3.0 | 3.2 | 2.9 |
| patterned warping [mm] | | 1.0 | 1.5 | 1.2 | 1.5 | 1.5 | 1.3 | 1.0 | 1.0 | 1.8 | 2.1 | 2.5 | 1.8 |
| dimensional change [%] | | 0.02 | 0.05 | 0.06 | 0.05 | 0.02 | 0.03 | 0.03 | 0.04 | 0.03 | 0.05 | 0.06 | 0.03 |
| wire bonding property [g] | Au wire diam 0.25 mm (%) | 9.5 | 9.0 | 9.0 | 9.5 | 8.5 | 9.0 | 8.5 | 8.8 | 8.0 | 8.0 | 9.5 | 8.0 |
| | Au wire diam 0.25 mm (σ) | 0.2 | 0.1 | 0.2 | 0.2 | 0.2 | 0.1 | 0.3 | 0.2 | 0.6 | 0.8 | 0.3 | 0.6 |
| punchability poor solder heat resistance | | good 0/5 | good 0/5 | good 0/5 | good 0/5 | good 0/5 | good 0/5 | good 0/5 | good 0/5 | good 0/5 | poor 0/5 | good 0/5 | poor 0/5 |

| Base Film Properties | | | | | | | | | | | | | |
|---|---|---|---|---|---|---|---|---|---|---|---|---|---|
| type | | A | I | J | K | L | M | N | O | P | A | A | A |
| thickness (μm) | | 50 | 60 | 55 | 50 | 50 | 50 | 50 | 20 | 50 | 50 | 50 | 50 |
| coefficient of linear expansion (ppm/°C.) | MD | 16 | 19 | 19 | 15 | 13 | 21 | 14 | 14 | 16 | 16 | 16 | 16 |
| | TD | 21 | 22 | 21 | 20 | 18 | 26 | 17 | 17 | 19 | 21 | 21 | 21 |
| | TD-MD | 5 | 3 | 2 | 5 | 5 | 5 | 3 | 3 | 3 | 5 | 5 | 5 |
| tensile elastic modulus [MPa] | TD | 7.9 | 7.1 | 6.7 | 9.7 | 6.0 | 6.2 | 6.1 | 11.0 | 6.0 | 7.9 | 7.9 | 7.9 |
| heat shrinkage [%] | TD | 0.01 | 0.01 | 0.00 | 0.25 | 0.04 | 0.04 | 0.09 | 0.10 | 0.03 | 0.01 | 0.01 | 0.01 |

TABLE 3-continued

| | | | | | | | | | | | | | | |
|---|---|---|---|---|---|---|---|---|---|---|---|---|---|---|
| humid coef. of expansion [ppm/°C.] | TD | 8.5 | 8.8 | 8.8 | 8.3 | 15.0 | 8.9 | 16.0 | 10.0 | 2.0 | 8.5 | 8.5 | 8.5 | |
| water absorption [%] | TD | 1.4 | 1.4 | 1.5 | 1.4 | 1.6 | 1.4 | 1.9 | 0.5 | 0.1 | 1.4 | 1.4 | 1.4 | |
| thermal conductivity [W/m·K] | | 0.28 | 0.30 | 0.32 | 0.27 | 0.29 | 0.30 | 0.18 | 0.15 | 0.65 | 0.28 | 0.28 | 0.28 | |
| water vapour transmittance [g/m2/24 h] | | 0.04 | 0.05 | 0.05 | 0.04 | 0.07 | 0.06 | 0.73 | 0.02 | 0.01 | 0.04 | 0.04 | 0.04 | |
| Adhesive Agent Properties | | | | | | | | | | | | | | |
| hase | | 15 | 3 | 3 | 3 | 3 | 3 | 3 | 3 | 3 | 17 | 18 | 18 | |
| elastic modulus [MPa] | 25° C. 110 Hz | 800 | 1100 | 1100 | 1100 | 1100 | 1100 | 1100 | 1100 | 1100 | 950 | 1050 | 1000 | |
| | 150° C. 110 Hz | 15 | 135 | 135 | 135 | 135 | 135 | 135 | 135 | 135 | 90 | 105 | 125 | |
| coef linear expansion [ppm/°C.] | | 250 | 105 | 105 | 105 | 105 | 105 | 105 | 105 | 150 | 100 | 63 | 72 | |
| Sample Properties | | | | | | | | | | | | | | |
| copper laminated warping [mm] | | 3.0 | 2.0 | 5.0 | 6.1 | 3.8 | 3.5 | 4.5 | 3.5 | 3.1 | 2.1 | 1.6 | 2.6 | |
| patterned warping [mm] | | 2.0 | 0.8 | 3.0 | 4.2 | 3.5 | 3.2 | 4.5 | 2.5 | 1.5 | 1.0 | 1.2 | 1.2 | |
| dimensional change [%] | | 0.06 | 0.04 | 0.30 | 0.11 | 0.08 | 0.05 | 0.09 | 0.05 | 0.05 | 0.04 | 0.03 | 0.06 | |
| wire bonding property [g] | Au wire diam 0.25 mm (%) | 7.2 | 9.0 | 7.6 | 7.4 | 9.5 | 9.0 | 8.5 | 8.8 | 9.3 | 8.5 | 10.5 | 10.0 | |
| | Au wire diam 0.25 mm (σ) | 0.7 | 0.3 | 0.4 | 0.5 | 0.3 | 0.1 | 0.1 | 0.2 | 0.2 | 0.3 | 0.4 | 0.3 | |
| punchability poor solder resistance | | good 0/5 | good 0/5 | good 0/5 | good 0/5 | good 0/5 | good 0/5 | good 3/5 | good 3/5 | good 5/5 | good 0/5 | good 0/5 | good 0/5 | |
| Base Film Properties | | | | | | | | | | | | | | |
| type | | A | A | A | A | A | A | O | R | O | O | O | O | S |
| thickness (μm) | | 50 | 50 | 50 | 50 | 50 | 50 | 50 | 50 | 50 | 50 | 50 | 50 | 75 |
| coefficient of linear expansion (ppm/°C.) | MD | 16 | 16 | 16 | 16 | 16 | 16 | 13 | 26 | 13 | 13 | 13 | 13 | 19 |
| | TD | 21 | 21 | 21 | 21 | 21 | 21 | 14 | 26 | 14 | 14 | 14 | 14 | 22 |
| | TD-MD | 5 | 5 | 5 | 5 | 5 | 5 | 1 | 0 | 1 | 1 | 1 | 1 | 3 |
| tensile elastic modulus [MPa] | TD | 7.9 | 7.9 | 7.9 | 7.9 | 7.9 | 7.9 | 8.6 | 3.1 | 8.6 | 8.6 | 8.6 | 8.6 | 7.1 |
| heat shrinkage [%] | TD | 0.01 | 0.01 | 0.01 | 0.01 | 0.01 | 0.01 | 0.04 | 0.00 | 0.04 | 0.04 | 0.04 | 0.04 | 0.01 |
| humid coef of expan. [ppm/°C.] | TD | 8.5 | 8.5 | 8.5 | 8.5 | 8.5 | 8.5 | 8.3 | 25.0 | 8.3 | 8.3 | 8.3 | 8.3 | 8.8 |
| water absorption [%] | TD | 1.4 | 1.4 | 1.4 | 1.4 | 1.4 | 1.4 | 1.6 | 2.9 | 1.6 | 1.6 | 1.6 | 1.6 | 1.4 |
| thermal conductivity [W/m·K] | | 0.28 | 0.28 | 0.28 | 0.28 | 0.28 | 0.28 | 0.32 | 0.18 | 0.32 | 0.32 | 0.32 | 0.32 | 0.30 |
| water vapour trans. [g/m2/24 h] | | 0.04 | 0.04 | 0.04 | 0.04 | 0.04 | 0.04 | 0.04 | 1.13 | 0.04 | 0.04 | 0.04 | 0.04 | 0.05 |
| Adhesive Agent Props | | | | | | | | | | | | | | |
| hase | | 10 | 18 | 0 | 1 | 3 | 6 | 3 | 3 | 38 | 25 | 40 | 30 | 18 |
| elastic modulus | 25° C. 110 Hz | 1050 | 1250 | 1360 | 1550 | 1200 | 1000 | 1100 | 1100 | 100 | 150 | 300 | 350 | 400 |

TABLE 3-continued

| [MPa] | 150° C. 110 Hz | 135 | 137 | 140 | 135 | 131 | 108 | 135 | 135 | 4 | 9 | 22 | 30 | 45 |
|---|---|---|---|---|---|---|---|---|---|---|---|---|---|---|
| coef linear expansion [ppm/° C.] | | 80 | 65 | 81 | 75 | 69 | 95 | 105 | 105 | 506 | 320 | 200 | 210 | 103 |
| Sample Properties | | | | | | | | | | | | | | |
| Cu laminated warping [mm] | | 1.9 | 2.6 | 2.1 | 2.0 | 2.5 | 2.5 | 5.0 | 7.0 | 6.2 | 7.4 | 5.7 | 7.8 | 2.0 |
| patterned warping [mm] | | 1.2 | 1.5 | 1.1 | 1.2 | 1.6 | 1.7 | 4.5 | 4.5 | 5.3 | 6.3 | 4.5 | 6.5 | 1.0 |
| dimensional change [%] | | 0.04 | 0.05 | 0.02 | 0.05 | 0.03 | 0.07 | 0.05 | 0.05 | 0.20 | 0.30 | 0.15 | 0.20 | 0.02 |
| wire bonding property [g] | Au wire diam 0.25 mm (%) | 11.0 | 11.5 | 12.0 | 10.0 | 8.7 | 9.5 | 7.0 | 7.0 | 2.0 | 4.5 | 5.2 | 5.0 | 9.0 |
| | Au wire diam 3.25 mm (σ) | 0.4 | 0.3 | 0.3 | 0.3 | 0.2 | 0.3 | 0.8 | 1.0 | 0.5 | 0.6 | 0.8 | 0.7 | 0.5 |
| punchability | | good | good | good | good | good | good | good | good | poor | poor | poor | good | poor |
| poor solder heat resistance | | 0/5 | 0/5 | 0/5 | 0/5 | 0/5 | 0/5 | 1/5 | 4/5 | 0/5 | 1/5 | 1/5 | 0/5 | 0/5 |

What is claimed is:

1. An adhesive-backed tape for semiconductor devices comprising a laminate of an insulating film layer and at least one adhesive agent layer,
wherein the insulating film layer has a coefficient of linear expansion in the film transverse direction (TD) at 50–200° C. of 17–30 ppm/° C. and a tensile modulus of elasticity at room temperature of 6–12 GPa and wherein the adhesive agent layer contains epoxy resin and at least one type of polyamide resin of an acid value of at least 3.

2. An adhesive-backed tape for semiconductor devices according to claim 1 having a coefficient of linear expansion in the film transverse direction (TD) at 50–200° C. of 19–25 ppm/° C.

3. An adhesive-backed tape for semiconductor devices according to claim 1 having a tensile modulus of elasticity at room temperature of 7–10 GPa.

4. An adhesive-backed tape for semiconductor devices according to claim 1, wherein the thickness of the insulating film layer is 10–65 μm.

5. An adhesive-backed tape for semiconductor devices according to claim 1, wherein the difference in the transverse direction (TD) and machine direction (MD) coefficients of linear expansion of the insulating film layer is 3–10 ppm/° C.

6. An adhesive-backed tape for semiconductor devices according to claim 1, wherein the humidity coefficient of expansion of the insulating film is no more than 23 ppm/% RH.

7. An adhesive-backed tape for semiconductor devices according to claim 1, wherein the percentage heat shrinkage of the insulating film layer is 0.0% to 0.2%.

8. An adhesive-backed tape for semiconductor devices according to claim 1, wherein the water absorption of the insulating film layer is no more than 1.7%.

9. An adhesive-backed tape for semiconductor devices according to claim 1, wherein the thermal conductivity of the insulating film layer is no more than 0.40 W/m.K.

10. An adhesive-backed tape for semiconductor devices according to claim 1, wherein the water vapour transmittance of the insulating film layer is at least 0.04 g/m$^2$/24 h by conversion to 1 mm of film thickness.

11. An adhesive-backed tape for semiconductor devices according to claim 1, wherein the chief component of the insulating film layer is a polyimide resin.

12. An adhesive-backed tape for semiconductor devices according to claim 1, wherein the elastic modulus of the adhesive agent layer in the TD at 150° C. is 1 MPa–5 GPs and the coefficient of linear expansion at 25–150° C. is in the range of 10–500 ppm/° C.

13. An adhesive-backed tape for semiconductor devices according to claim 1, wherein the haze of the adhesive agent layer is no more than 20.

14. An adhesive-backed tape for semiconductor devices according to claim 1, wherein the adhesive agent layer contains at least one type of thermo setting resin selected from the group consisting of epoxy resins, phenolic resins, polyimide resins and maleimide resins and mixtures thereof.

15. An adhesive-backed tape for semiconductor devices according to claim 1, wherein the adhesive agent layer contains thermosetting resin and at least one type of thermoplastic resin selected from the group consisting of polyamides, acrylonitrile-butadiene copolymer (NBR), polyesters and polyurethanes and mixtures thereof.

16. A copper-clad laminate comprising an adhesive-backed tape for semiconductor devices according to claim 1.

17. A semiconductor device comprising a copper-clad laminate for semiconductor devices according to claim 16.

18. A semiconductor connecting substrate comprising an adhesive-backed tape for semiconductor devices according to claim 1.

19. A semiconductor device comprising a semiconductor connecting substrate according to claim 18.

* * * * *